US012633363B2

(12) United States Patent
Jung et al.

(10) Patent No.: US 12,633,363 B2
(45) Date of Patent: May 19, 2026

(54) ENCODED READ-ONLY MEMORY AND DECODER

(71) Applicant: QUALCOMM Incorporated, San Diego, CA (US)

(72) Inventors: Chulmin Jung, San Diego, CA (US); Anil Chowdary Kota, San Diego, CA (US); Kuk-Hwan Kim, San Diego, CA (US); Sung Son, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 126 days.

(21) Appl. No.: 18/605,079

(22) Filed: Mar. 14, 2024

(65) Prior Publication Data

US 2025/0292847 A1 Sep. 18, 2025

(51) Int. Cl.
 *G11C 17/12* (2006.01)
 *H10B 20/00* (2023.01)

(52) U.S. Cl.
 CPC ......... *G11C 17/126* (2013.01); *H10B 20/387* (2023.02)

(58) Field of Classification Search
 CPC ............................ G11C 17/126; H10B 20/387
 See application file for complete search history.

(56) References Cited

U.S. PATENT DOCUMENTS

2007/0242543 A1 10/2007 Romanovskyy et al.
2009/0003029 A1 1/2009 Kato

2009/0273999 A1 11/2009 Chen et al.
2011/0273919 A1* 11/2011 Buer ...................... G11C 17/08
                                                                  365/104
2021/0012835 A1 1/2021 Cho et al.
2023/0005546 A1 1/2023 Chen et al.
2023/0185460 A1 6/2023 Kim et al.
2024/0161843 A1 5/2024 Chang et al.
2024/0185934 A1 6/2024 Lien et al.
2025/0087254 A1 3/2025 Kim et al.
2025/0232819 A1 7/2025 Vimercati
2025/0292848 A1 9/2025 Jung et al.

FOREIGN PATENT DOCUMENTS

EP           3203478 A1     8/2017

OTHER PUBLICATIONS

Partial International Search Report—PCT/US2025/012204—ISA/ EPO—Mar. 20, 2025.
International Search Report and Written Opinion—PCT/US2025/ 012204—ISA/EPO—Jun. 12, 2025.

* cited by examiner

*Primary Examiner* — Xiaochun L Chen
(74) *Attorney, Agent, or Firm* — Loza & Loza, LLP

(57) ABSTRACT

A drain programmed read-only memory includes a plurality of bit lines for each drain-programmed transistor. In addition, the drain-programmed read-only memory includes a pair of ground lines for each drain-programmed transistor. A decoder decodes a plurality of bits from each drain-programmed transistor by determining which bit line (if any) and which ground line is coupled to the drain-programmed transistor.

20 Claims, 11 Drawing Sheets

-- Prior Art --

100

-- Prior Art --

400

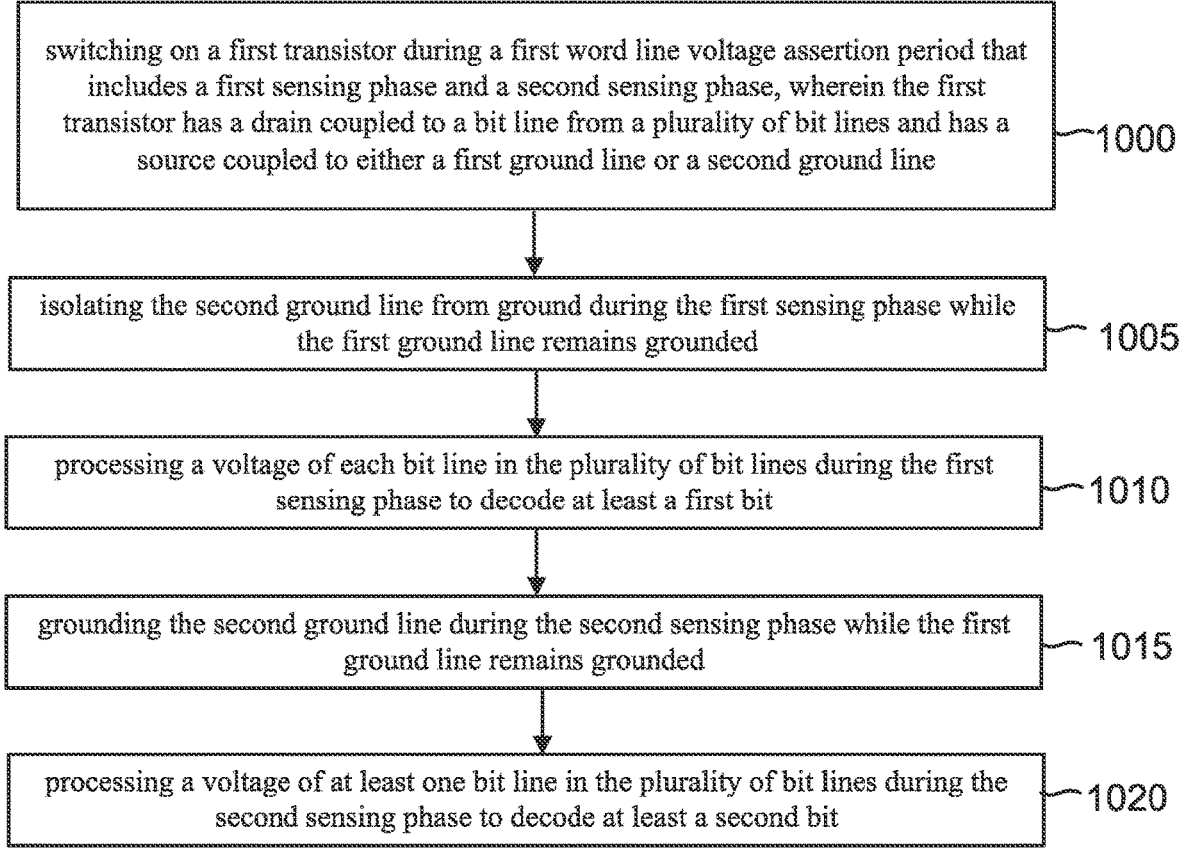

switching on a first transistor during a first word line voltage assertion period that includes a first sensing phase and a second sensing phase, wherein the first transistor has a drain coupled to a bit line from a plurality of bit lines and has a source coupled to either a first ground line or a second ground line ⎯1000 isolating the second ground line from ground during the first sensing phase while the first ground line remains grounded ⎯ 1005 processing a voltage of each bit line in the plurality of bit lines during the first sensing phase to decode at least a first bit ⎯1010 grounding the second ground line during the second sensing phase while the first ground line remains grounded ⎯ 1015 processing a voltage of at least one bit line in the plurality of bit lines during the second sensing phase to decode at least a second bit ⎯1020

FIG. 10

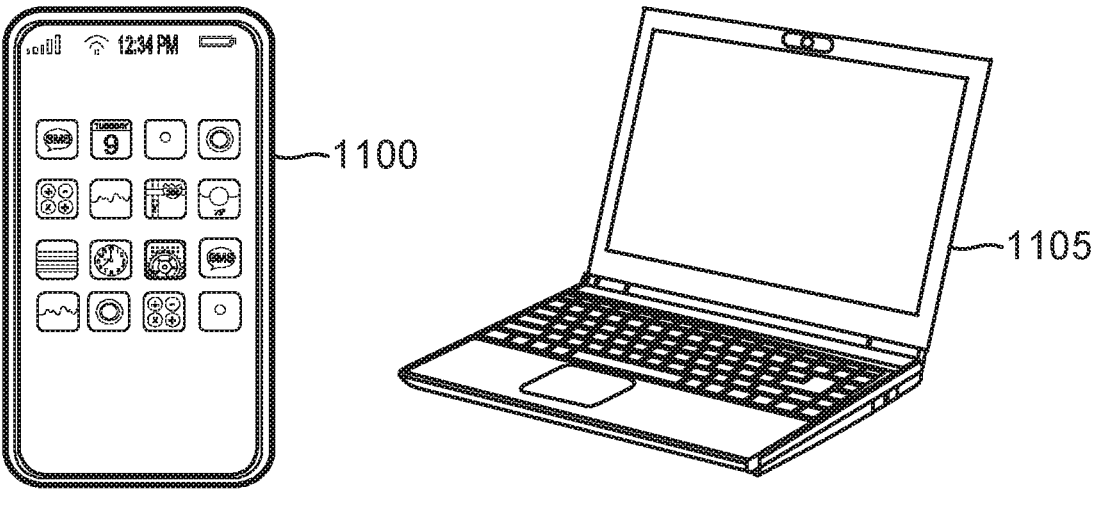
—1100
—1105
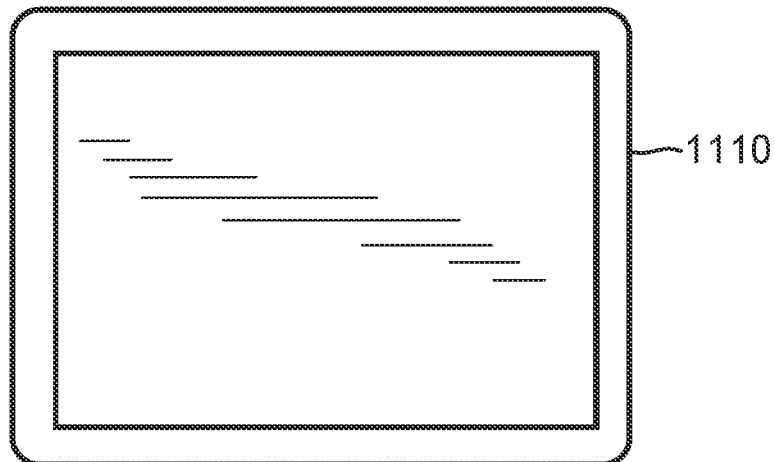
—1110
FIG. 11

ENCODED READ-ONLY MEMORY AND DECODER

TECHNICAL FIELD

This application relates to memories, and more particularly to an encoded read-only memory (ROM) and a decoder for the encoded ROM.

BACKGROUND

One form of a mask-programmable read-only memory involves the programming of a source connection to ground for a metal-oxide-semiconductor field-effect transistor (MOSFET) such as an n-type-metal-oxide-semiconductor (NMOS) transistor. Depending upon the bit being encoded, the source connection to ground is formed or not formed. To increase density, a pair of such source-programmed MOSFETS may share a drain connection to a bit line.

SUMMARY

A read-only memory is provided that includes: a plurality of transistors arranged into a column; a plurality of bit lines, each bit line extending across the column; a first ground line extending across the column; and a second ground line extending across the column, wherein each transistor in the plurality of transistors is configured to encode for a plurality of bits through having a source coupled to the first ground line or to the second ground line and through having a drain coupled to one of the bit lines in the plurality bit lines or through having a floating drain.

In addition, a bitcell for a read-only memory is provided that includes: a semiconductor substrate including a diffusion region configured to form a drain and a source of a first transistor and to form a drain and a source of a second transistor; a first word line positioned between the drain and the source of the first transistor; a first dummy word line positioned between the drain of the first transistor and the source of the second transistor; a second word line positioned between the drain and the source of the second transistor; a metal layer above the semiconductor substrate, the metal layer being configured to include a first bit line and a second bit line that both extend from a first side of the bitcell to a second side of the bitcell; and a first via coupled between either the first bit line or the second bit line and the drain of the second transistor, wherein the drain of the first transistor is configured to float with respect to the first bit line and the second bit line.

Finally, a read-only memory is provided that includes: a plurality of bit lines including a first bit line and a second bit line; and a first transistor having a drain coupled to the first bit line; and a decoder configured to determine that the first transistor has its drain coupled to the first bit line to decode a first bit.

These and other advantageous features may be better appreciated through the following detailed description.

BRIEF DESCRIPTION OF THE DRAWINGS

FIG. 10 is a flowchart for a method of operation for a drain programmed ROM in accordance with an aspect of the disclosure.

FIG. 11 illustrates some example electronic systems including a multi-bit-per-transistor drain-programmed ROM in accordance with an aspect of the disclosure.

Implementations of the present disclosure and their advantages are best understood by referring to the detailed description that follows. It should be appreciated that like reference numerals are used to identify like elements illustrated in one or more of the figures.

DETAILED DESCRIPTION

A mask-programmed ROM is compact and thus relatively-low cost as compared to other types of memories. By adjusting the photolithography during the manufacture of a mask-programmed ROM, a designer may encode the mask-programmed ROM with the desired data. As semiconductor manufacturing technology has progressed from one technology node to another to produce ever-more miniaturized devices, the layout requirements of a mask-programmed ROM have led to the use of a source-programmed implementation.

In a source-programmed ROM, each bit is written by the source programming of a corresponding transistor. In an n-type metal-oxide-semiconductor (NMOS) source-programmed ROM, the source programming for each transistor determines whether the transistor has a source coupled to ground. In general, one binary state for a stored bit may be represented by programing a transistor to have its source coupled to ground. Conversely, a complementary binary state for a stored bit may be represented by programming a transistor to have its source electrically isolated from ground.

Figure 1:
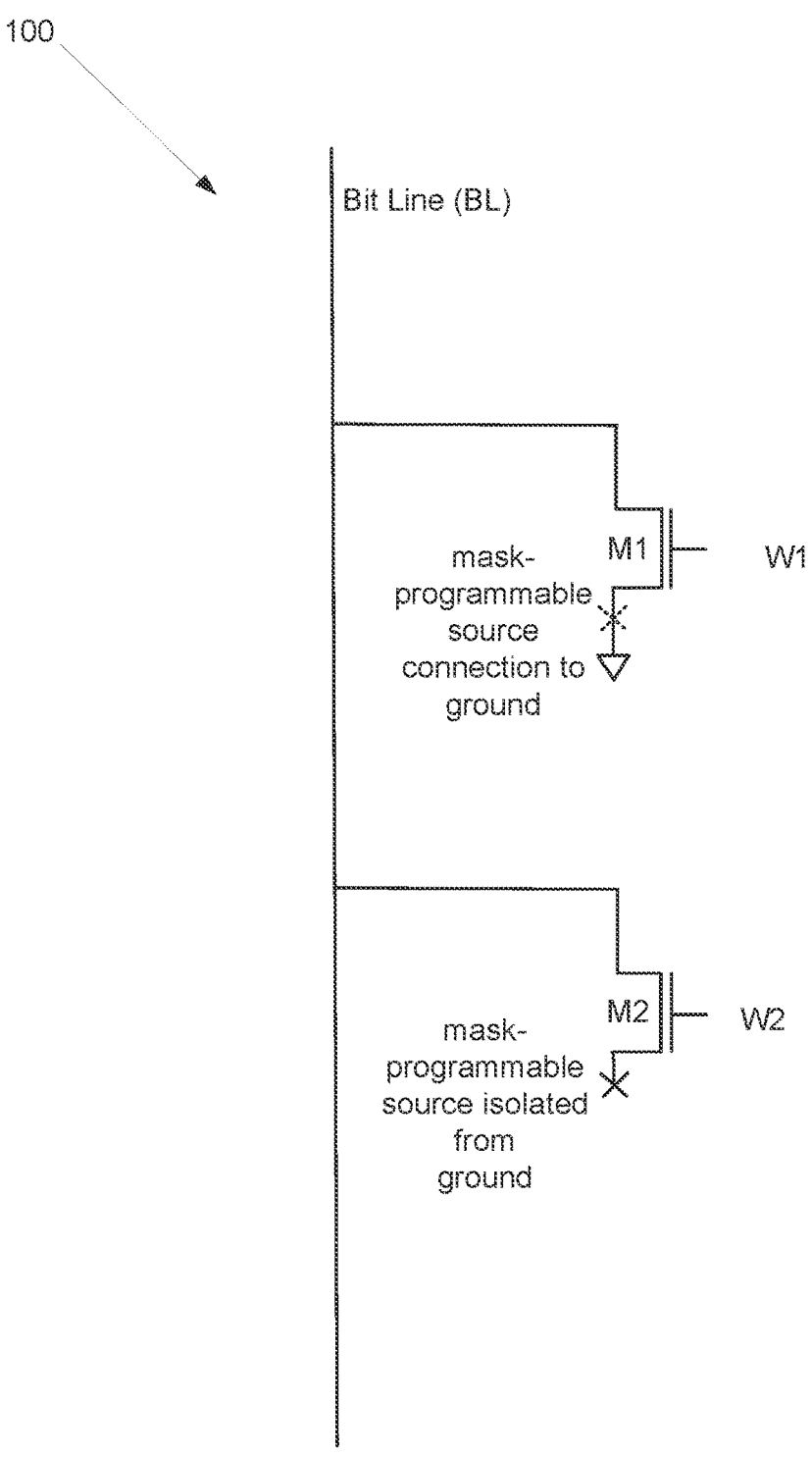
FIG. 1 is a circuit diagram of a traditional source-programmed ROM.

To provide a better understanding of why modern mask-programmed ROMs are typically source-programmed, an example source-programmed NMOS ROM 100 will be discussed as shown in FIG. 1. ROM 100 includes an NMOS transistor M1 and an NMOS transistor M2 that are each included within the height and width of a bitcell. In that regard, the term bitcell as used herein refers to the semiconductor area for a pair of neighboring transistors and the associated dummy gates. A source-programmed bitcell thus stores two bits. Since the storage of each bit requires only one transistor, ROM 100 has an advantageously-high density as compared to memories that require more than one transistor per stored bit. The drain of each transistor M1 and M2 couples to a bit line (BL). The source programming determines whether transistors M1 and M2 each has a source coupled to ground. During a read operation for ROM 100, bit line BL is first pre-charged through a coupling to a power supply node (not illustrated) for a power supply voltage VDD. Bit line BL is then isolated from the power supply node so that the pre-charged bit line BL floats prior to the read operation.

To read the binary content stored by transistor M1, a word line W1 that couples to a gate of transistor M1 is asserted to the power supply voltage VDD. Since transistor M1 has a source connection to ground, the assertion of the gate voltage for transistor M1 discharges the pre-charged bit line to ground so that a sense amplifier (e.g., an inverter) may sense the binary zero encoded by the source programming of transistor M1. Similarly, a word line W2 is asserted to the power supply voltage VDD during a read operation to transistor M2. But transistor M2 was mask programmed to not have a source connection to ground. The assertion of the word line W2 voltage thus does not discharge the bit line voltage.

Figure 2:
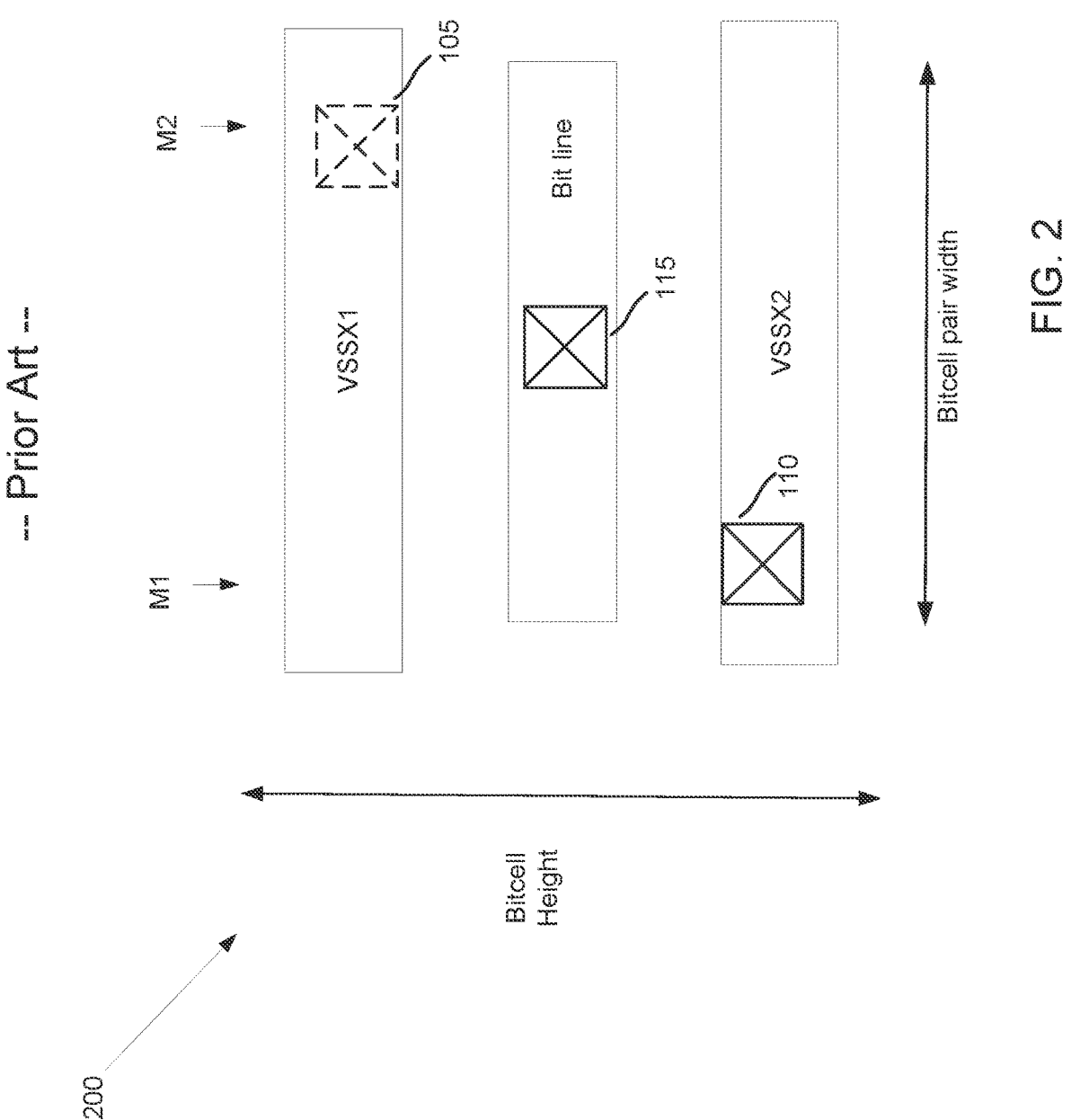
FIG. 2 illustrates a metal-layer layout for a pair of transistors in the source-programmed ROM of FIG. 1.

ROM 100 is integrated into an active surface of a semiconductor die as known in the integrated circuit arts. Signals, power, and ground for the ROM 100 are carried in leads formed in metal layers adjacent the active surface. A ROM integrated circuit will include a plurality of metal layers, ranging from a first metal layer that is closest to the active surface of the semiconductor die to a final metal layer that is furthest from the active surface. A layout for the first metal layer for a traditional source-programmed bitcell 200 is shown in FIG. 2. Transistors M1 and M2 are adjacent to each other. Each transistor fits within a common bitcell height. During the integrated circuit manufacturing process, the first metal layer is patterned into a bit line lead to form the bit line and also into two tracks or leads for ground. A ground lead VSSX2 near the bottom of the bitcell height is the ground for transistor M1 depending upon the source programming. Similarly, a ground lead VSSX1 near the top of the bitcell height is the ground for transistor M2 depending upon the source programming. Since transistor M1 is source programmed to store a binary zero, a via 110 couples from VSSX2 to the source of transistor M1. Should transistor M2 be similarly source programmed to couple its source to ground, a via 105 couples from ground VSSX1 to the source of transistor M2. In this example, it is assumed that transistor M2 is programmed to store a binary one so that via 105 would not be present for such a programming. Both transistors M1 and M2 have a shared drain coupled to the bit line through a via 115. Note the challenge in the metal layer layout for ROM 100. Each transistor M1 and M2 must fit within a relatively short bitcell height and requires its own ground. These design constraints have generally forced designers into a source programming implementation as opposed to a drain programming implementation in which the transistor drains are selectively coupled (or not coupled) to the bit line.

Figure 3:
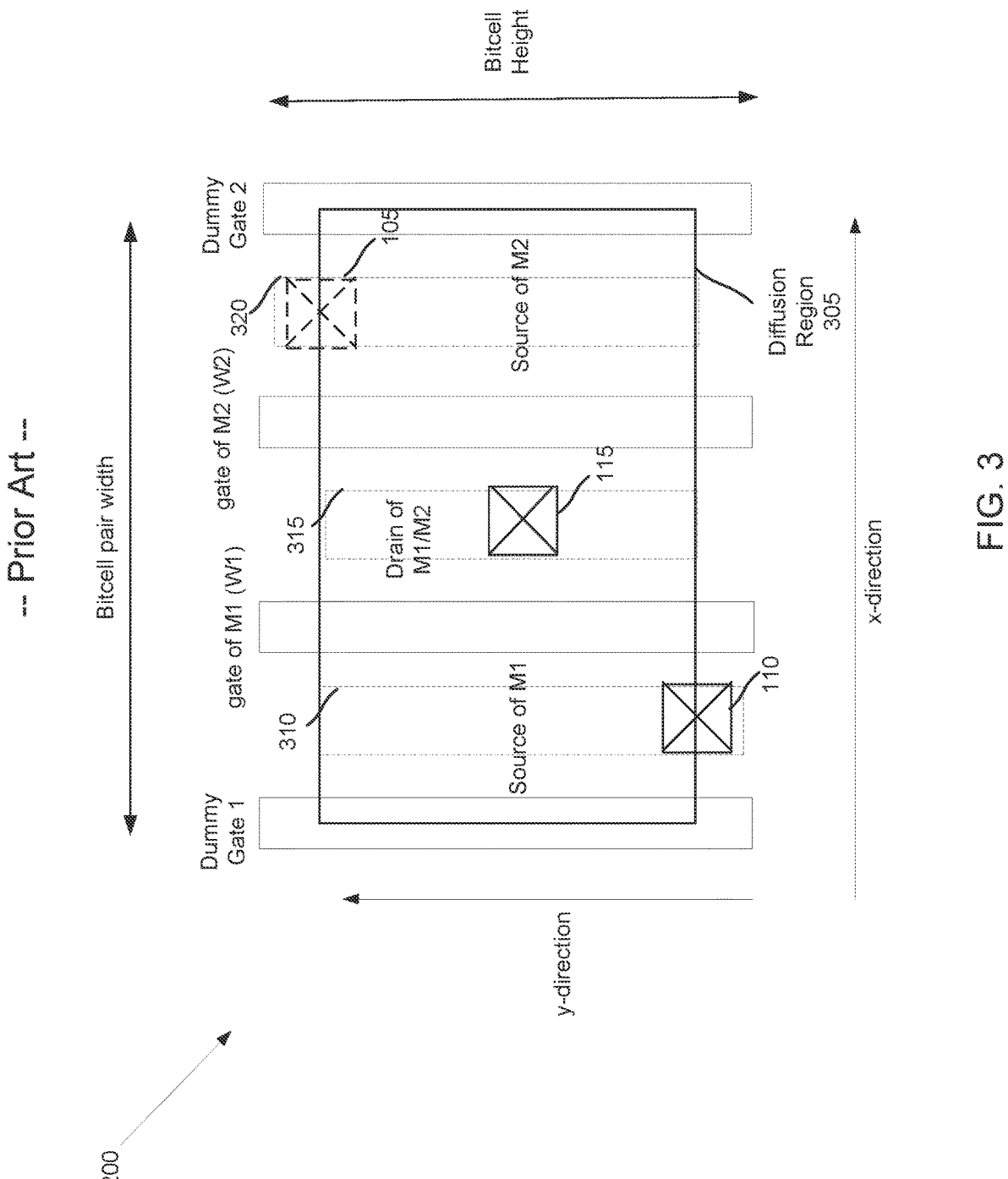
FIG. 3 illustrates a device-layer layout for the pair of transistors in the source-programmed ROM of FIGS. 1 and 2.

The device layer (active semiconductor surface) layout for the bitcell 200 is shown in FIG. 3. An n-doped diffusion region 305 forms consecutively in the x-direction the source of transistor M1, a shared drain of transistors M1 and M2, and the source of transistor M2. Diffusion region 305 is shown extending across only the bitcell width but it will be appreciated that diffusion region 305 may extend to additional bitcells. Transistor M1 is isolated from any neighboring bitcell (not illustrated) by a first dummy gate 1 that traverses across diffusion region 305 in the y-direction. A polysilicon gate of transistor M1 that is coupled to the first word line (W1) also traverses across the diffusion region 305 in the y-direction. Similarly, a polysilicon gate of transistor M2 that is coupled to the second word line (W2) also traverses across the diffusion region 305 in the y-direction. A second dummy gate 2 isolates the source of transistor M2 from any neighboring bitcell (not illustrated) in the same bitcell height. The source via 110 (when present) for transistor M1 couples to a column 310 of local interconnect that extends across the source of transistor M1. As known in the local interconnect arts, column 310 may be formed from a deposition of a metal such as copper. Via 115 couples to the shared drain of transistors M1 and M2 through a similar column 315 of local interconnect. Finally, a source via 105 (when present) couples to the source of transistor M2 through another column 320 of local interconnect.

Although this source programming is driven by the layout needs of fitting the pair of transistors within such a relatively-short bitcell height, the bitcell 200 provides only one stored bit per transistor. An encoded drain-programmed ROM is disclosed herein in which each transistor encodes for a plurality of bits. As implied by the term "drain-programmed," it is the drain connection to the ROM transistors that is mask programmed such that the drain may or may not be coupled to a corresponding bit line. This drain programming is quite advantageous in reducing leakage current as compared to the use of source programming. The number of bits encoded depends upon the number of bit lines and a corresponding number of word lines. For example, an encoded source-programmed ROM bitcell with two drain-programmed NMOS MOSFETs, two word lines, and two bit lines encodes for four bits (two bits per transistor). As will be explained further herein the resulting encoding leads to an advantageous increase in density in terms of the semiconductor die area required to encode a bit as compared to a traditional source-programmed ROM.

Figure 4:
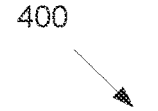
FIG. 4 is a circuit diagram for a two-bits-per-transistor drain-programmed ROM in accordance with an aspect of the disclosure.

An example two-bits-per-transistor source-programmed ROM 400 is shown in FIG. 4. There are two sensing phases for the ROM 400. In a first sensing phase, a VSS1 ground line or lead is charged to a power supply voltage and isolated from ground by an NMOS transistor M4. A source of the transistor M4 couples to ground whereas its drain couples to the VSS1 ground line. An enable signal PH2_ENB that drives the gate of transistor M4 is discharged during the first sensing phase to maintain transistor M4 off so that the VSS1 ground line retains its charge. A VSS0 ground line is grounded during both the first sensing phase and a subsequent second sensing phase. During the second sensing phase, the enable signal PH2_ENB is charged to the power supply voltage to switch transistor M4 on to ground the VSS1 ground line. The VSS1 ground line is thus grounded only during the second sensing phase but remains charged during the first sensing phase. In contrast, the VSS0 ground line is grounded during both sensing phases. The VSS0 ground line is also denoted herein as a first ground line. Similarly, the VSS1 ground line is also denoted herein as a second ground line.

ROM 400 includes four drain-programmed NMOS transistors M0 through M3 arranged into a column. More generally, ROM 400 may include fewer than four drain-programmed transistors or more than four drain-programmed transistors depending upon the number of bits that are to be encoded. A drain-programmed transistor may have a selective drain coupling either to a zeroth bit line BL0 or to a first bit line BL1. Alternatively, a drain-programmed transistor may have no drain connection to either bit line such that its drain terminal floats. In addition, each drain-programmed transistor has a source coupled to either the VSS0 ground line or to the VSS1 ground line (or lead).

Whether a drain-programmed transistor has a source connection to either the VSS0 ground line or to the VSS1 ground line may be deemed to encode a first bit. Similarly, whether a drain-programmed transistor has a drain connection to either the zeroth bit line BL0 or to the first bit line BL1 may be deemed to encode a second bit. Each drain-programmed transistor in the ROM 400 thus encodes for two bits. But note that there is the possibility of having no drain connection to either of the bit lines. It may thus be seen that the encoding of two bits by a drain-programmed transistor in the ROM 400 may be represented by an "alphabet" of four choices from a set of five possible configurations for a drain-programmed transistor: two configurations result from the source connection being made to either one of the VSS0 and VSS1 ground lines, two configurations result from the drain connection being made to either the zeroth bit line BL0 or to the first bit line BL1, and a fifth choice results from forming no drain connection to either of the bit lines.

For example, one implementation of ROM 400 would be for each drain-programmed transistor to have a drain connection to either the zeroth bit line BL0 or to the first bit line BL1. But in that case, a bit line will always be discharged in either the first sensing phase or the second sensing phase. It thus saves power to have the encoding alphabet include the possibility of no drain connection such as transistor M3. Transistor M3 has a source connection to the first ground lead VSS1 but its drain floats. A third word line WL3 couples to the gate of transistor M3 and is charged during both the first sensing phase and the second sensing phase of transistor M3. Although transistor M3 is thus switched on, the first bit line BL1 and the second bit line BL1 will remain charged during both the first sensing phase and during the second sensing phase. There is thus no bit line discharge during the sensing of transistor M3.

Transistor M3 could alternatively have a source connection to the zeroth ground lead VSS0 instead of coupling to the first ground lead VSS1. It will not matter since in both cases, neither bit line will be discharged during the sensing of transistor M3. The remaining drain-programmed transistors in the ROM 400 have a drain connection to one of the bit lines. For example, the zeroth drain-programmed transistor M0 has its drain coupled to the zeroth bit line BL0 and has a source coupled to the VSS0 ground line. A zeroth word line WL0 that couples to a gate of transistor M0 is charged during both the first sensing phase of transistor M0 and during the second sensing phase of transistor M0 to switch on transistor M0. The zeroth bit line BL0 is thus discharged during both sensing phases of transistor M0 whereas the first bit line BL1 remains charged.

In addition, a first drain-programmed transistor M1 has its drain coupled to the first bit line BL1 and has a source coupled to the VSS0 ground line. A first word line WL1 that couples to a gate of transistor M1 is charged during both the first sensing phase of transistor M1 and during the second sensing phase of transistor M1 to switch on transistor M1. The first bit line BL1 is thus discharged during both sensing phases of transistor M1 whereas the zeroth bit line BL0 remains charged.

Finally, a second drain-programmed transistor M2 has its drain coupled to the zeroth bit line BL0 and has a source coupled to the first ground lead VSS1. A second word line WL2 that couples to a gate of transistor M2 is charged during both the first sensing phase of transistor M2 and during the second sensing phase of transistor M2 to switch on transistor M2. The zeroth bit line BL0 is thus discharged only during the second sensing phase but remains charged during the first sensing phase. The first bit line BL1 remains charged during both the first and the second sensing phases of transistor M2. Transistors M0, M1, M2, and M3 are also denoted herein as a first transistor, a second transistor, a third transistor, and a fourth transistor, respectively. Similarly, the zeroth bit line and the first bit line are also denoted herein as a first bit line and a second bit line, respectively.

Figure 5:
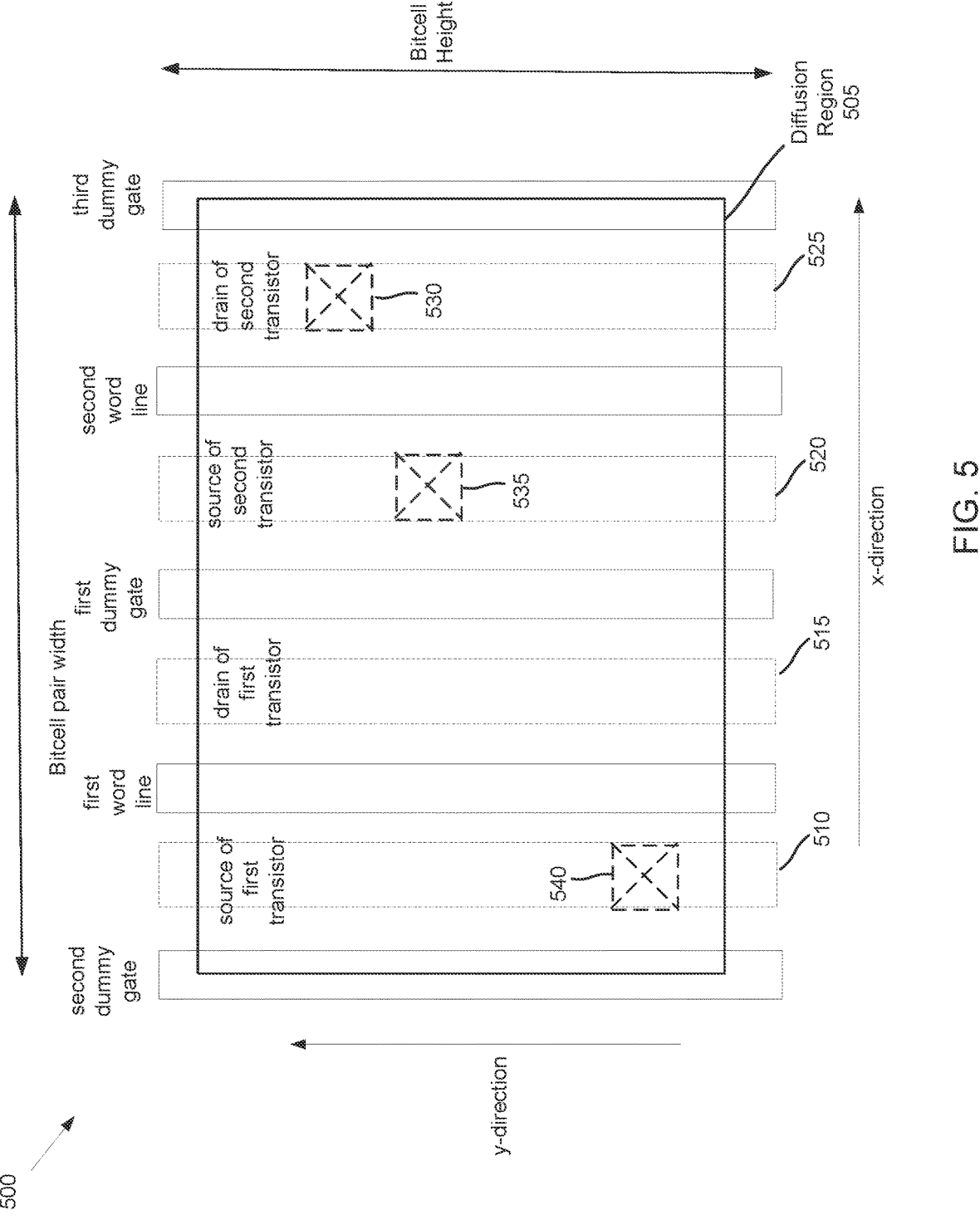
FIG. 5 illustrates a device-layer layout for a bitcell including a pair of transistors in the ROM of FIG. 4 in accordance with an aspect of the disclosure.

A device layer (active surface) layout for a bitcell 500 for ROM 400 is shown in FIG. 5. A spacing between a center of a second dummy gate and a center of a third dummy gate spans a width of the bitcell 500 in the x-direction. In turn, this width is divided by first dummy gate extending in the y-direction to separate a diffusion region 505 into the active regions for a pair of a drain-programmed transistors formed by a first transistor and a second transistor. The first transistor has a source region traversed in the y-direction by a column of local interconnect 510. A polysilicon first word line forms a gate for the first transistor to separate its source from its drain. A column of local interconnect 515 traverses in the y-direction the drain of the first transistor. The second transistor has a source region traversed in the y-direction by a column of local interconnect 520. A polysilicon second word line forms a gate for the second transistor to separate the second transistor's source from its drain. A column of local interconnect 525 traverses the second transistor's drain in the y-direction.

Since the dummy gates may also be formed from polysilicon, the dummy gates and word lines are separated according to a polysilicon pitch such that a width of the bitcell 500 extends across four polysilicon pitches. In contrast, the bitcell 200 discussed earlier extends across just three polysilicon pitches. Despite this larger size for bitcell 500 assuming that the same process node is used for both ROMs 400 and 100, note that the semiconductor die space per stored bit is smaller for bitcell 500 as compared to bitcell 200 since bitcell 500 stores four bits whereas bitcell 200 stores just two bits. The drain programming of ROM 400 thus advantageously reduces the semiconductor area needed to store a given number of bits as compared to storing the same number of bits in ROM 100.

Figure 6:
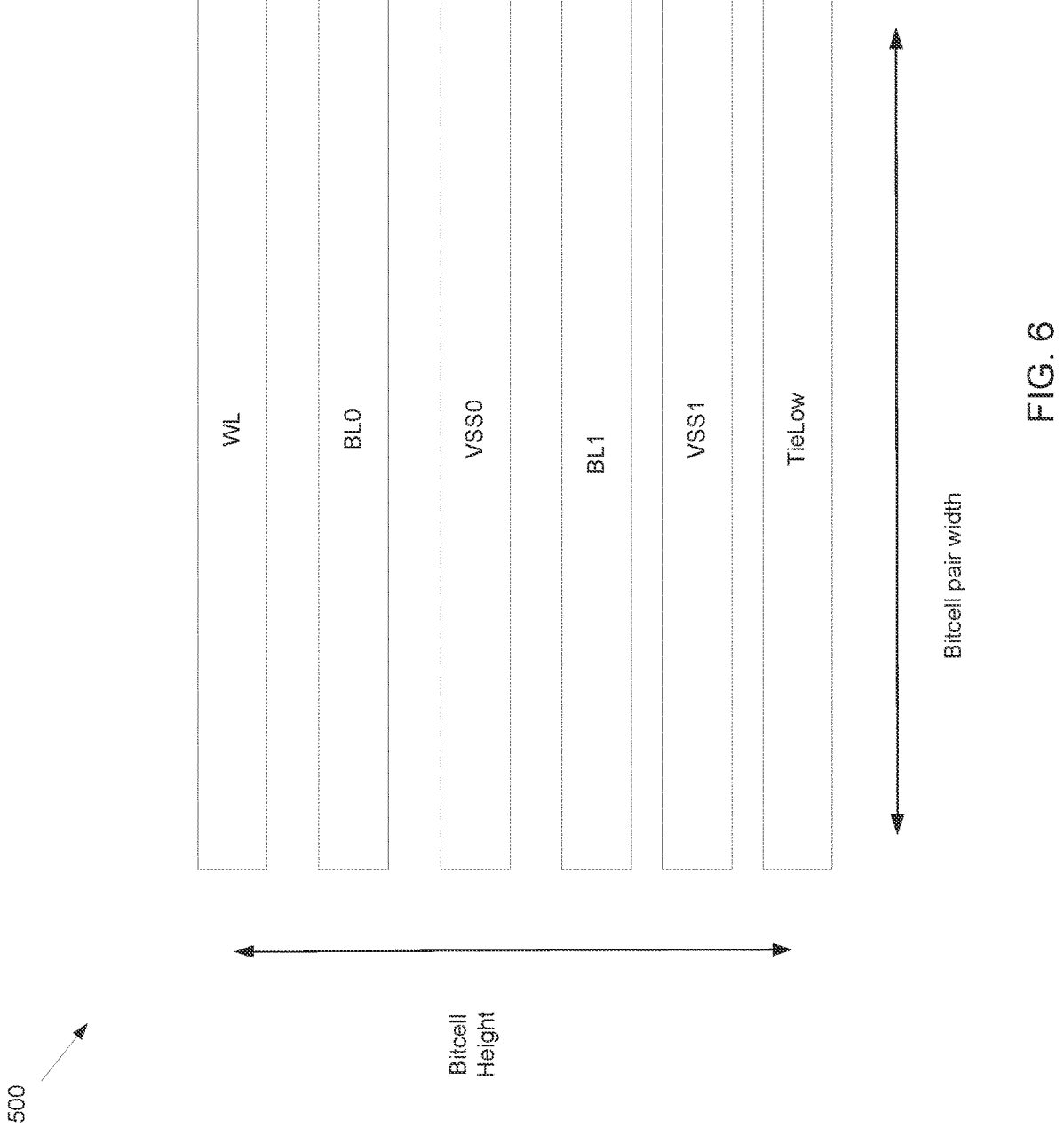
FIG. 6 illustrates a metal-layer layout for the bitcell of FIG. 5 in accordance with an aspect of the disclosure.

Each source for each transistor in the pair of transistors in the bitcell 500 couples to either the ground line VSS0 or the ground line VSS1 through a corresponding via as will be discussed further herein. Similarly, each drain (if so programmed) for each transistor in the pair of transistors in the bitcell 500 couples to either the first bit line BL1 or the zeroth bit line BL0 through a corresponding via as will also be further discussed herein. The bit lines and ground lines may each be formed in a corresponding metal layer as shown in FIG. 6. It is advantageous to separate the zeroth bit line BL0 from the first bit line BL1 by the ground line VSS0 since the ground line VSS0 is grounded in both sensing phases and will thus act to shield the bit lines from each other. A metal line (WL) that contacts one of the word lines through a corresponding (via) extends across an upper limit of the bitcell 500 whereas a dummy metal line that is grounded (TieLow) extends across a lower limit of the bitcell 500. The ground line VSS1 extends between the first bit line BL1 and the dummy metal line.

Referring again to FIG. 5, the first transistor may be an example of transistor M3 in ROM 400 in that the drain of the first transistor floats with respect to the BL0 and BL1 bit lines. The source of the first transistor couples through a via 540 to the VSS1 ground line. However, the source of the first transistor may instead be coupled to the VSS0 ground line in alternative implementations. The second transistor is an example of transistor M0 in ROM 400 because the drain of the second transistor couples through a via 530 to the BL0 bit line whereas its source couples through a via 535 to the VSS0 ground line. However, the source of the second transistor may instead couple to the VSS1 ground line in alternative implementations. Similarly, the drain of the second transistor may instead couple to the BL1 bit line in alternative implementations.

Although other alphabets may be used as discussed earlier for ROM 400, the use of drain-programmed transistors M0 through M3 in ROM 400 leads to an advantageous decoding. As part of this decoding, the word line for the drain-programmed transistor being sensed switches on during the first sensing phase so that the bit line voltages may be developed and latched. The first sensing phase is also denoted herein as the VSS0 sensing phase since it is only the VSS0 ground line that is grounded during the first sensing phase. Similarly, the second sensing phase is also denoted herein as the VSS1 sensing phase since it only during the second sensing phase that the VSS1 ground line is grounded. The word line voltage for the transistor being sensed is asserted in both the VSS0 and the VSS1 sensing phases. With this terminology in mind, a state of binary variables representing the absence or not of a discharge of a corresponding bit line during the VSS0 and VSS1 sensing phases of ROM 400 is given by the following Table 1:

| WL | V1_BL1 | V1_BL0 | V0_BL1 | V0_BL0 | DOUT[1] | DOUT[0] |
|----|--------|--------|--------|--------|---------|---------|
| 0 | 1 | 0 | 1 | 0 | 0 | 0 |
| 1 | 0 | 1 | 0 | 1 | 0 | 1 |
| 2 | 1 | 0 | 1 | 1 | 1 | 0 |
| 3 | 1 | 1 | 1 | 1 | 1 | 1 | where a true state (a binary one) for a V1_BL1 variable indicates that the first bit line BL1 remained charged during the VSS1 sensing phase. Conversely, V1_BL1 being a binary zero indicates that the first bit line BL1 was discharged during the VSS1 sensing phase. The V1_BL1 variable is thus a binary representation of the first bit line charge during the VSS1 sensing phase. Similarly, a binary one for a V1_BL0 variable indicates that the zeroth bit line BL0 remained charged during the VSS1 sensing phase whereas a binary zero indicates that the zeroth bit line BL0 was discharged during the VSS1 sensing phase. In addition, a binary one for a V0_BL1 variable indicates that the first bit line BL1 remained charged during the VSS0 sensing phase. Conversely, V0_BL1 being a binary zero indicates that the first bit line BL1 was discharged during the VSS0 sensing phase. Finally, a binary one for a V0_BL0 variable indicates that the zeroth bit line BL0 remained charged during the VSS0 sensing phase whereas a binary zero indicates that the zeroth bit line BL0 was discharged during the VSS0 sensing phase. A data output bit DOUT[0] results from the decoding of the V0_BL0 and V0_BL1 variables from the VSS0 sensing phase. Similarly, a data output bit DOUT[1] results from the decoding of the V1_BL0 and V1_BL1 variables from the VSS1 sensing phase.

The preceding discussion for the sensing of the various drain-programmed transistors M0 through M3 supports the binary values shown in Table 1. For example, as discussed with regard to the assertion of the zeroth word line voltage WL0 for the sensing of the drain-programmed transistor M0, the zeroth bit line BL0 is discharged during both sensing phases whereas the first bit line BL1 remains charged. Thus, V1_BL1 and V1_BL0 for the assertion of the zeroth word line WL0 are both binary ones for the VSS1 and VSS0 sensing phases. Similarly, V1_BL0 and V0_BL0 are both binary zeroes for the VSS1 and VSS0 sensing phases while the zeroth word line WL0 is asserted. It may be seen that the data output bit DOUT[1] for each word line assertion results from an AND of the corresponding V0_BL1 and V0_BL0 variables. Similarly, the data output bit DOUT[0] for each word line assertion equals the corresponding V1_BL0 variable.

A decoder will be discussed herein that decodes the V1_BL1, V1_BL0, V0_BL1, and V0_BL0 variables to provide the two decoded output bits DOUT[1] and DOUT[0]. Referring again to Table 1, note that the data output bit DOUT[0] equals V1_BL0 for each word line assertion. The decoding to provide the data output signal DOUT[0] is thus advantageously efficient as the decoder need merely pass V1_BL0 to form DOUT[0]. In addition, the decoder need merely perform a logical AND of V0_BL1 and V0_BL0 to provide DOUT[1]. The choice of drain-programmed transistors M0 through M3 for the alphabet of ROM 400 is thus quite advantageous with respect to the decoding of the latched variables from the VSS0 and VSS1 sensing phases.

Figure 7:
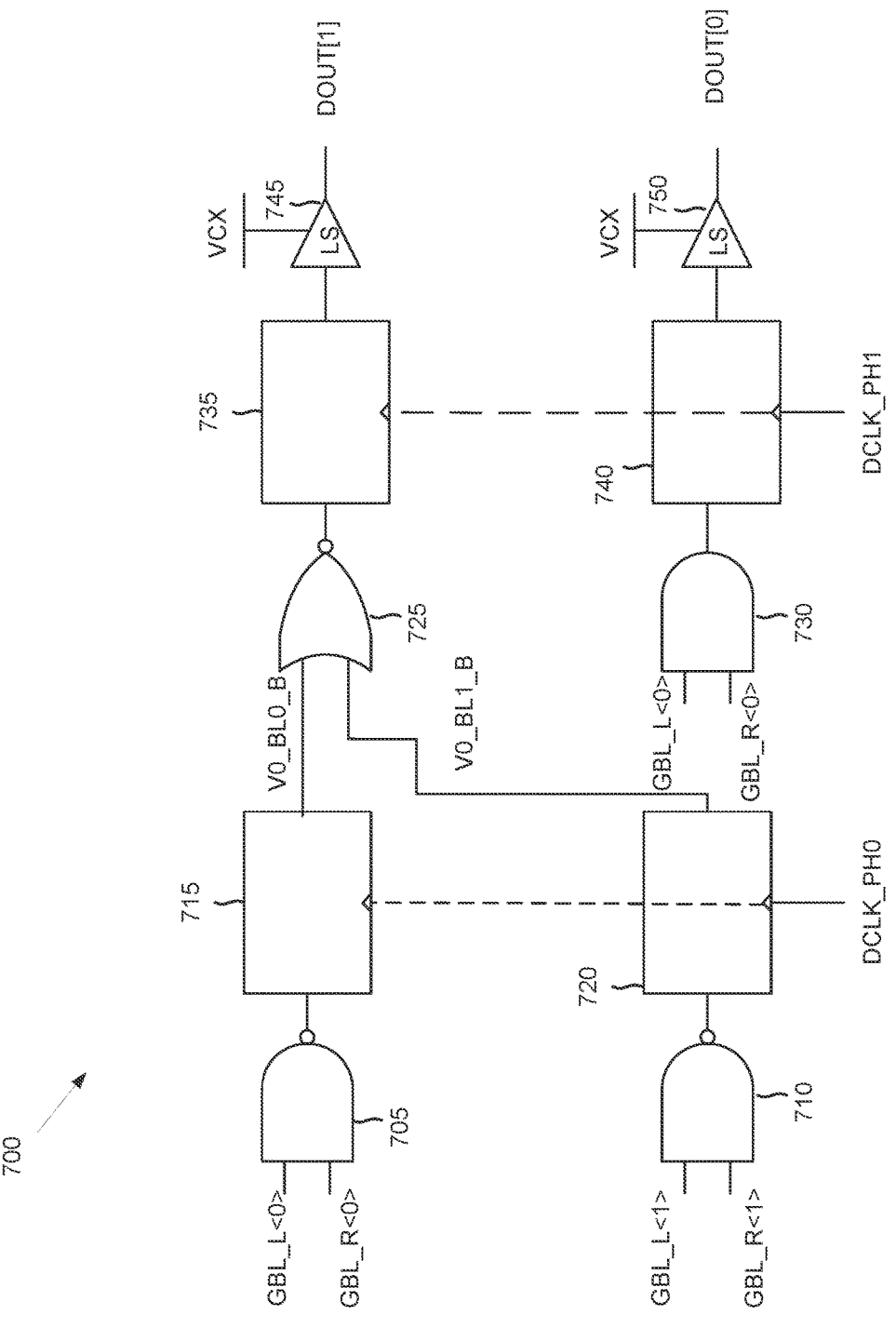
FIG. 7 is a circuit diagram of a decoder for the ROM of FIG. 4 in accordance with an aspect of the disclosure.

An example decoder 700 for ROM 400 is shown in FIG. 7. With respect to the bit line coupling to the decoder 700, ROM 400 may have its bitcells arranged into banks. Each bank has its own rows and columns of bitcells. Each column of bitcells is traversed by its own pair of bit lines (the zeroth bit line BL0 and the first bit line BL1). One bank may be denoted as a left bank whereas a neighboring bank may be denoted as a right bank. The zeroth bit line from a sensed column in the left bank couples to a global bit line GBL_L<0> that is received by a NAND gate 705. Similarly, the zeroth bit line from the corresponding column in the right bank couples to a global bit line GBL_R<0> that is also received by the NAND gate 705. Suppose that the left bank is being sensed. A voltage of the zeroth bit line from the right bank will thus be maintained at its pre-charged state of being charged to the memory power supply voltage. But the zeroth bit line from the left bank will have a voltage state during the VSS0 sensing phase that depends upon the programming of the corresponding bitcell's transistor's drain coupling and also whether its source couples to the VSS0 ground line. Since the right bank global bit line GBL_R<0> will be charged to the power supply voltage regardless of the binary value of the left bank global bit line GBL_L<0>, NAND gate 705 will act as an inverter to invert the left bank global bit line GBL_L<0> voltage to form a complement V0_BL0_B of the V0_BL0 variable. A memory circuit such as a latch 715 stores the complement V0_BL0_B variable responsive to an assertion of a clock signal DCLK_PH0 that is asserted during the VSS0 sensing phase. Should instead it be the right bank that is being sensed, the left bank global bit line GBL_L<0> would be maintained in its precharged state such that NAND gate 705 would invert the right bank global bit line voltage GLB_R<0> to form the complement V0_BL0_B variable.

The sensing of the first bit line during the VSS0 sensing phase is performed analogously. The first bit line from the sensed column in the left bank couples to a first global bit line GBL_L<1> that is received by a NAND gate 710. Similarly, the first bit line from the corresponding column in the right bank couples to a first global bit line GBL_R<1> that is also received by the NAND gate 710. Suppose that the left bank is being sensed. A voltage of the first bit line from the right bank will thus be maintained at its pre-charged state of being charged to the memory power supply voltage. But the first bit line from the left bank will have a voltage state during the VSS0 sensing phase that depends upon the programming of the corresponding bitcell transistor. Since the right bank global bit line GBL_R<1> will be charged to the power supply voltage regardless of the binary value of the left bank global bit line GBL_L<1>, NAND gate 710 will act also as an inverter to invert the left bank global bit line GBL_L<1> voltage to form a complement V0_BL1_B of the V0_BL1 variable. A memory circuit such as a latch 720 stores the complement V0_BL1_B variable responsive to an assertion of the clock signal DCLK_PH0 during the VSS0 sensing phase.

As discussed with respect to ROM 400, the use of the drain-programmed transistors M0 through M3 results in an advantageously efficient decoding. In particular, the data output signal DOUT[1] results from an AND of the V0_BL1 and V0_BL0 variables. Decoder 700 thus includes an NOR gate 725 that NORs the complement V0_BL0_B and V0_BL1_B variables. It can be shown that a NOR of the complement variables V0_BL0_B and V0_BL1_B is equivalent to an AND of the V0_BL0 and V0_BL1 variables. An output signal from the NOR gate 725 is stored in a memory circuit such as a latch 735 responsive to an assertion of a clock signal DCLK_PH1 that is asserted during the VSS1 sensing phase. A level-shifter (LS) 745 level-shifts an output signal from the latch 735 from the memory power voltage to a core power domain (CX) power supply voltage to provide the data output signal DOUT[1] that results from the ANDing of the V0_BL0 and V0_BL1 variables.

As also discussed with respect to ROM 400, the decoding to produce the data output signal DOUT[0] is also advantageous efficient as it may be produced by merely passing the V1_BL0 variable. In that regard, decoder 700 includes an AND gate 730 that ANDs the left bank zeroth global bit line GBL_L<0> voltage with the right bank global bit line GBL_R<0> voltage. Since the inactive one of the left and right bank's global bit lines will be charged to the memory power supply voltage, AND gate 730 acts as a buffer to pass the zeroth global bit line voltage from the sensed bank. This passed zeroth global bit line voltage is stored in a memory circuit such as a latch 740 responsive to an assertion of the DCLK_PH1 clock signal during the VSS1 sensing phase. After level-shifting to the core power domain through a level-shifter 750, the zeroth global bit line voltage from the sensed bank is passed to form the data output signal DOUT [0].

Not only does ROM 400 increase density as compared to the traditional source-programmed ROM 100, but the drain programming of ROM 400 also reduces power consumption. Referring again to FIG. 1, a transistor such as M1 in ROM 100 that has its source coupled to ground may conduct a sub-threshold leakage current to ground when the bit line is charged despite the word line W1 being discharged. This sub-threshold leakage may be mitigated or reduced by constructing transistors M1 and M2 to be thick-gate-oxide devices. The resulting high threshold voltage (high-VT) for the bitcell transistors may significantly reduce sub-threshold leakage currents for those transistors having their sources coupled to ground. But gate-induced drain leakage (GIDL) may still flow from the drain of the transistors even though their sources are disconnected from ground as shown for transistor M2. The GIDL currents undesirably may dominate the leakage budget of a ROM despite the use of high-VT transistors. In contrast, the drain programming of ROM 400 effectively eliminates the GIDL leakage currents to advantageously decrease power consumption.

Figure 8:
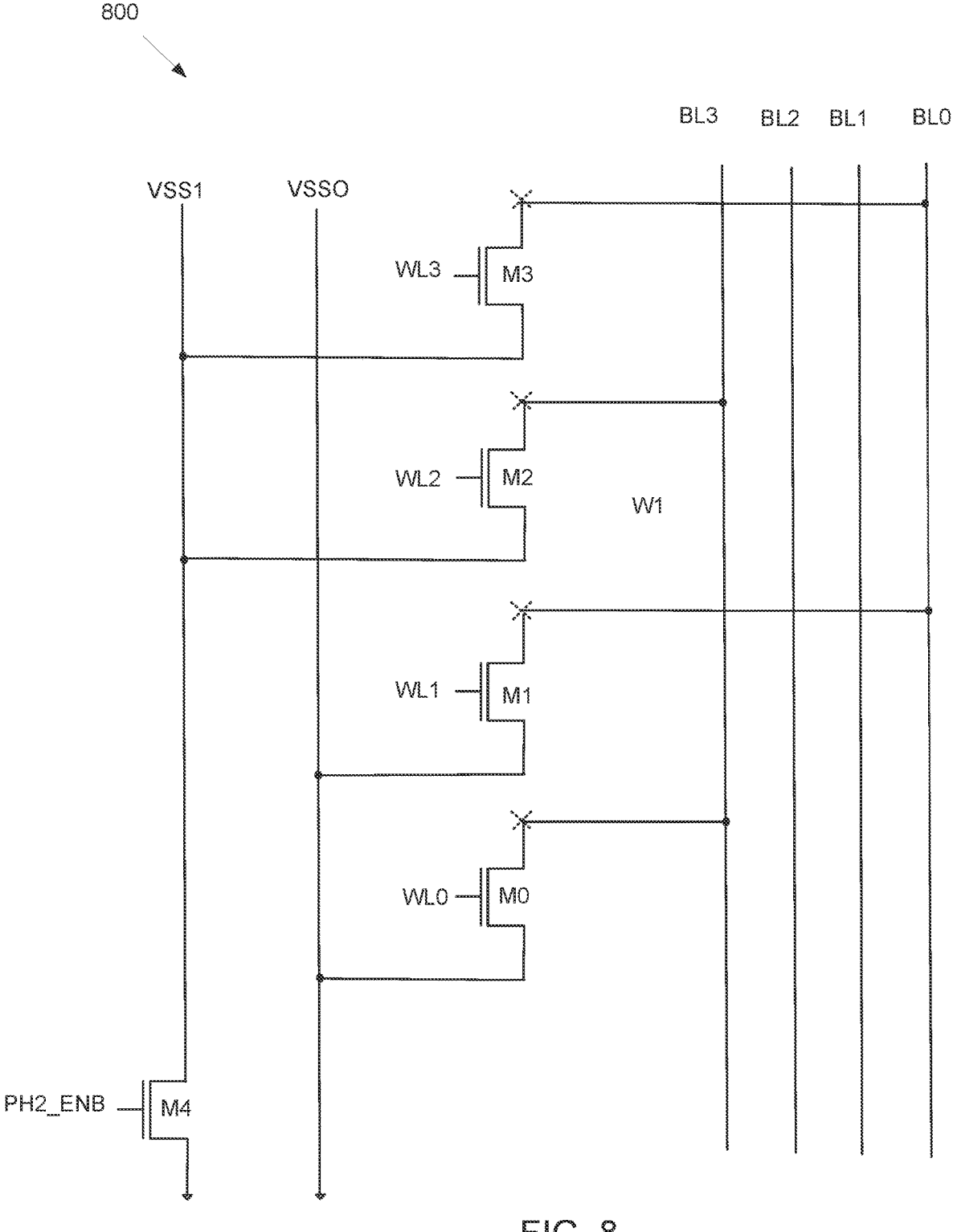
FIG. 8 is a circuit diagram of a three-bits-per-transistor drain-programmed ROM in accordance with an aspect of the disclosure.

As discussed with respect to ROM 400, one bit for each drain-programmed transistor is encoded through the selection of a bit line that couples (or not) to the transistor's drain. This encoding may be extended by adding additional bit lines. For example, a RAM 800 is shown in FIG. 8 in which each drain-programmed transistor in a column encodes for three bits. Two of the bits results from a selection from a set of four bit lines: a zeroth bit line BL0, first bit line BL1, a second bit line BL2, and a third bit line BL3. Each drain-programmed transistor may either have its drain coupled to one of these bit lines or alternatively its drain may float. Another bit results from the selection of which ground line (VSS0 or VSS1) that couples to the transistor's source.

ROM 800 includes four example drain-programmed transistors ranging from a zeroth transistor M0 to a third transistor M3. The third transistor M3 has its drain coupled to the zeroth bit line and its source coupled to the VSS1 ground line. A third word line WL3 drives a gate of transistor M3. A second transistor M2 has its source coupled to the VSS1 ground line and its drain coupled to the third bit line BL3. A second word line WL2 drives a gate of transistor M2. A first transistor M1 has its source coupled to the VSS0 ground line and its drain coupled to the zeroth bit line. A first word line WL1 drives a gate of transistor M1. Finally, the zeroth transistor M0 has its source coupled to the VSS0 ground line and its drain coupled to the third bit line. A zeroth word line WL0 drives a gate of transistor M0. A decoder (not illustrated) would thus determine which bit line is coupled to a given transistor and which ground line is coupled to the transistor to decode three bits.

Figure 9:
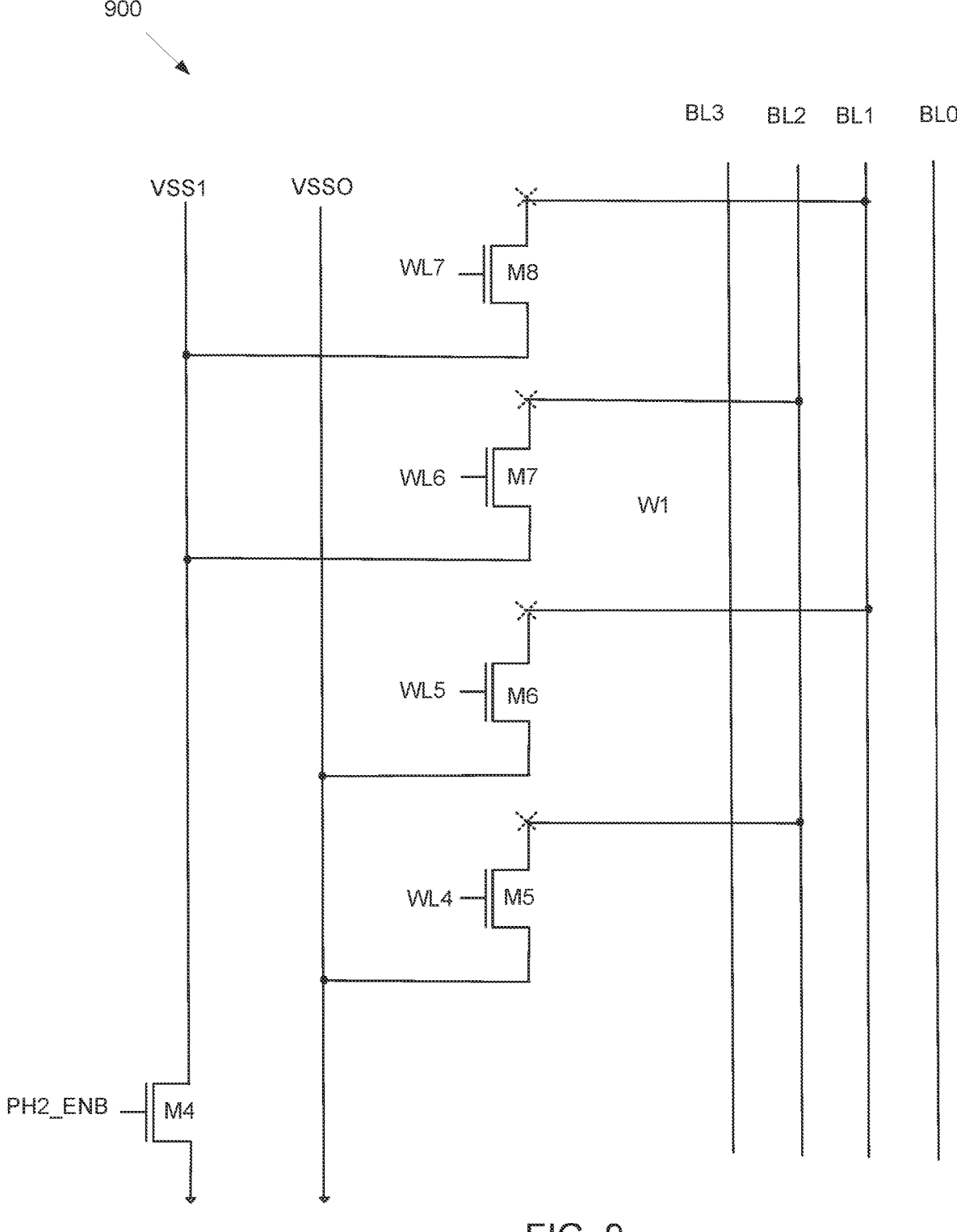
FIG. 9 is a circuit diagram of a three-bits-per-transistor drain-programmed ROM in accordance with an aspect of the disclosure.

With respect to the four bit lines, there are two possibilities for a transistor having a drain coupled to a given one of the bit lines, which is to have a source coupled to either one of the VSS1 and VSS0 ground lines. With respect to the coupling to the zeroth bit line, transistors M3 and M1 in ROM 800 represent the two possible ground line couplings. Similarly, transistors M2 and M0 represent the two possible ground line couplings for a drain coupling to the third bit line BL3. Referring now to a ROM 900 shown in FIG. 9, the source line couplings for a drain coupling to either the first bit line or the second bit line is shown. In particular, a transistor M5 and a transistor M7 both have their drain coupled to the second bit line BL2. Transistor M5 has a source coupled to the VSS0 ground line whereas transistor M7 has a source coupled to the VSS1 ground line. Similarly, a transistor M6 and a transistor M8 both have their drain coupled to the first bit line BL1. Transistor M6 has its source coupled to the VSS0 ground line whereas transistor M8 has its source coupled to the VSS1 ground line. Note that there is a ninth transistor configuration not shown in ROMs 800 or 900 in which the transistor's drain floats but has a source coupled to either the VSS1 or the VSS0 ground line. Word lines WL4, WL5, WL6, and WL7 couple respectively to the gates of transistors M5, M6, M7, and M8.

A method of operating a ROM in accordance with the disclosure will now be discussed with reference to the flowchart of FIG. 10. The method includes an act 1000 of switching on a first transistor during a first word line voltage assertion period extending across a first sensing phase and a second sensing phase, wherein the first transistor has a drain coupled to a bit line from a plurality of bit lines and has a source coupled to either a first ground line or a second ground line. The switching on of any of the transistors M0 through M3 in ROM 300 is an example of act 1000. Similarly, the switching on of any of the transistors M0 through M3 in ROM 800 or the switching on of any of the transistors M4 through M7 in ROM 900 is an example of act 100. The method also includes an act 1005 of isolating the second ground line from ground during the first sensing phase while the first ground line remains grounded. The default off state of the enable signal PH2_ENB keeping switch transistor M4 off during the first sensing phase in any of the ROMS 400, 800, and 900 is an example of act 1005. The method further includes an act 1010 of processing a voltage of at least one of the bit lines in the plurality of bit lines to decode at least a first bit during the first sensing phase. The processing of the zeroth bit line voltage in the decoder 700 during the first sensing phase to provide the data output bit DOUT[0] is an example of act 1010. In addition, the method includes an act 1015 of grounding the second ground line during the second sensing phase while the first ground line remains grounded. The switching on of the switch transistor M4 in any of the ROMs 400, 800, and 900 is an example of act 1015. Finally, the method includes an act 1020 of processing a voltage of each of the bit lines in the plurality of bit lines to decode at least a second bit during the second sensing phase. The decoding of the second data output bit DOUT[1] in decoder 700 is an example of act 1020.

A read-only memory as disclosed herein may be incorporated in a wide variety of electronic systems. For example, as shown in FIG. 11, a cellular telephone 1100, a laptop computer 1105, and a tablet PC 1110 may all include a read-only memory in accordance with the disclosure. Other exemplary electronic systems such as an earbud, a music player, a video player, a communication device, and a personal computer may also be configured with a read-only memory constructed in accordance with the disclosure.

The disclosure will now be summarized in the following series of example clauses:

Clause 1. A read-only memory comprising:
a plurality of transistors arranged into a column;
a plurality of bit lines, each bit line extending across the column;
a first ground line extending across the column; and
a second ground line extending across the column, wherein each transistor in the plurality of transistors is configured to encode for a plurality of bits through having a source coupled to the first ground line or to the second ground line and through having a drain coupled to one of the bit lines in the plurality bit lines or through having a floating drain.

Clause 2. The read-only memory of clause 1, further comprising:
a plurality of word lines corresponding to the plurality of transistors, each transistor having a gate coupled to a corresponding one of the word lines in the plurality of word lines.

Clause 3. The read-only memory of any of clauses 1-2, wherein the plurality of bit lines comprises a first bit line and a second bit line, and wherein the plurality of transistors includes:
a first transistor having a floating drain and having a source coupled to the second ground line; and
a second transistor having a drain coupled to the first bit line and having a source coupled to the second ground line.

Clause 4. The read-only memory of clause 3, wherein the plurality of transistor further comprises:
a third transistor having a drain coupled to the second bit line and having a source coupled to the first ground line; and
a fourth transistor having a drain coupled to the first bit line and having a source coupled to the first ground line.

Clause 5. The read-only memory of any of clauses 3-4, wherein the plurality of word lines comprises:
a first word line coupled to a gate of the first transistor; and a second word line coupled to a gate of the second transistor.

Clause 6. The read-only memory of any of clauses 1-5, comprising:
a switch transistor coupled between the second ground line and ground.

Clause 7. The read-only memory of clause 2, wherein the plurality of bit lines comprises a first bit line, a second bit line, a third bit line, and a fourth bit line, and wherein the plurality of transistors includes:
a first transistor having a drain coupled to the fourth bit line and having a source coupled to the first ground line;
a second transistor having a drain coupled to the first bit line and having a source coupled to the first ground line;
a third transistor having a drain coupled to the fourth bit line and having a source coupled to the second ground line; and
a fourth transistor having a drain coupled to the first bit line and having a source coupled to the second ground line.

Clause 8. The read-only memory of clause 7, further comprising:
a fifth transistor having a drain coupled to the third bit line and having a source coupled to the first ground line;
a sixth transistor having a drain coupled to the second bit line and having a source coupled to the first ground line;
a seventh transistor having a drain coupled to the third bit line and having a source coupled to the second ground line; and
an eighth transistor having a drain coupled to the second bit line and having a source coupled to the second ground line.

Clause 9. The read-only memory of any of clauses 7-8, further comprising:
a first word line coupled to a gate of the first transistor;
a second word line coupled to a gate of the second transistor;
a third word line coupled to a gate of the third transistor; and
a fourth word line coupled to a gate of the fourth transistor.

Clause 10. A bitcell for a read-only memory, comprising:
a semiconductor substrate including a diffusion region configured to form a drain and a source of a first transistor and to form a drain and a source of a second transistor;
a first word line positioned between the drain and the source of the first transistor;
a first dummy word line positioned between the drain of the first transistor and the source of the second transistor;
a second word line positioned between the drain and the source of the second transistor;
a metal layer above the semiconductor substrate, the metal layer being configured to include a first bit line and a second bit line that both extend from a first side of the bitcell to a second side of the bitcell; and
a first via coupled between either the first bit line or the second bit line and the drain of the second transistor, wherein the drain of the first transistor is configured to float with respect to the first bit line and the second bit line.

Clause 11. The bitcell of clause 10, further comprising;
  a second dummy word line configured to extend along a first side of the bitcell; and
  a third dummy word line configured to extend along a second side of the bitcell.

Clause 12. The bitcell of any of clauses 10-11, wherein the metal layer is further configured to include a first ground line and a second ground line, the read-only memory bitcell further comprising:
  a second via coupled between the source of the first transistor and either one of the first ground line and the second ground line; and
  a third via coupled between the source of the second transistor and either one of the first ground line and the second ground line.

Clause 13. The bitcell of clause 12, wherein the first ground line is positioned between the first bit line and the second bit line; and wherein the second ground line is positioned between the second bit line and a bottom of the bitcell.

Clause 14. The bitcell of any of clause 11-13, wherein the first dummy word line, the second dummy word line, the third dummy word line, the first word line, and the second word line all comprise polysilicon lines spaced apart according to a polysilicon line pitch.

Clause 15. The bitcell of any of clauses 11-13, wherein the metal layer is further configured to includes a dummy line extending along a bottom of the bitcell and a word line extending across a top of the bitcell.

Clause 16. A read-only memory comprising:
  a plurality of bit lines including a first bit line and a second bit line;
  a first transistor having a drain coupled to the first bit line; and
  a decoder configured to determine that the first transistor has its drain coupled to the first bit line to decode a first bit.

Clause 17. The read-only memory of clause 16, further comprising:
  a first ground line; and
  a second ground line, wherein the first transistor includes a source coupled to the first ground line, and wherein the decoder is further configured to determine that the first transistor has its source coupled to the first ground line to decode a second bit.

Clause 18. The read-only memory of any of clauses 16-17, further comprising:
  a switch transistor coupled between the second ground line and ground, wherein the read-only memory is configured to maintain the switch transistor off during a first sensing phase for the decoder and to maintain the switch transistor on during a second sensing phase for the decoder.

Clause 19. The read-only memory of clause 17, wherein the first transistor is included within a bitcell including a second transistor.

Clause 20. The read-only memory of clause 19, wherein the second transistor has a drain coupled to the second bit line and has a source coupled to the second ground line.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A read-only memory comprising:
  a plurality of transistors arranged into a column;
  a plurality of bit lines, each bit line extending across the column;
  a first ground line extending across the column; and
  a second ground line extending across the column, wherein each transistor in the plurality of transistors is configured to encode for a plurality of bits through having a source coupled to the first ground line or to the second ground line and through having a drain coupled to one of the bit lines in the plurality of bit lines or through having a floating drain.

2. The read-only memory of claim 1, further comprising:
  a plurality of word lines corresponding to the plurality of transistors, each transistor having a gate coupled to a corresponding one of the word lines in the plurality of word lines.

3. The read-only memory of claim 2, wherein the plurality of bit lines comprises a first bit line and a second bit line, and wherein the plurality of transistors includes:
  a first transistor having a floating drain and having a source coupled to the second ground line; and
  a second transistor having a drain coupled to the first bit line and having a source coupled to the second ground line.

4. The read-only memory of claim 3, wherein the plurality of transistors further comprises:
  a third transistor having a drain coupled to the second bit line and having a source coupled to the first ground line; and
  a fourth transistor having a drain coupled to the first bit line and having a source coupled to the first ground line.

5. The read-only memory of claim 3, wherein the plurality of word lines comprises:
  a first word line coupled to a gate of the first transistor; and
  a second word line coupled to a gate of the second transistor.

6. The read-only memory of claim 1, comprising:
  a switch transistor coupled between the second ground line and ground wherein the read-only memory is configured to maintain the switch transistor off during a first sensing phase for a decoder and to maintain the switch transistor on during a second sensing phase of the decoder.

7. The read-only memory of claim 2, wherein the plurality of bit lines comprises a first bit line, a second bit line, a third bit line, and a fourth bit line, and wherein the plurality of transistors includes:
  a first transistor having a drain coupled to the fourth bit line and having a source coupled to the first ground line;
  a second transistor having a drain coupled to the first bit line and having a source coupled to the first ground line;
  a third transistor having a drain coupled to the fourth bit line and having a source coupled to the second ground line; and
  a fourth transistor having a drain coupled to the first bit line and having a source coupled to the second ground line.

8. The read-only memory of claim 7, further comprising:

a fifth transistor having a drain coupled to the third bit line and having a source coupled to the first ground line;

a sixth transistor having a drain coupled to the second bit line and having a source coupled to the first ground line;

a seventh transistor having a drain coupled to the third bit line and having a source coupled to the second ground line; and an eighth transistor having a drain coupled to the second bit line and having a source coupled to the second ground line.

9. The read-only memory of claim 7, further comprising:

a first word line coupled to a gate of the first transistor;

a second word line coupled to a gate of the second transistor;

a third word line coupled to a gate of the third transistor; and a fourth word line coupled to a gate of the fourth transistor.

10. A bitcell for a read-only memory, comprising:

a semiconductor substrate including a diffusion region configured to form a drain and a source of a first transistor and to form a drain and a source of a second transistor;

a first word line positioned between the drain and the source of the first transistor;

a first dummy word line positioned between the drain of the first transistor and the source of the second transistor;

a second word line positioned between the drain and the source of the second transistor;

a metal layer above the semiconductor substrate, the metal layer being configured to include a first bit line and a second bit line that both extend from a first side of the bitcell to a second side of the bitcell;

a first via coupled between either the first bit line or the second bit line and the drain of the second transistor, wherein the drain of the first transistor is configured to float with respect to the first bit line and the second bit line;

a second via coupled between the source of the first transistor and either a first ground line or a second ground line; and a third via coupled between the source of the second transistor and either the first ground line or the second ground line.

11. The bitcell of claim 10, further comprising;

a second dummy word line configured to extend along a first side of the bitcell; and a third dummy word line configured to extend along a second side of the bitcell.

12. The bitcell of claim 10, wherein the first ground line is positioned between the first bit line and the second bit line; and wherein the second ground line is positioned between the second bit line and a bottom of the bitcell.

13. The bitcell of claim 11, wherein the first dummy word line, the second dummy word line, the third dummy word line, the first word line, and the second word line all comprise polysilicon lines spaced apart according to a polysilicon line pitch.

14. The bitcell of claim 12, wherein the metal layer is further configured to include a dummy line extending along a bottom of the bitcell and a word line extending across a top of the bitcell.

15. The bitcell of claim 10, further comprising;

a decoder configured to determine that the first transistor has its drain coupled to the first bit line to decode a first bit in a first phase and to determine that the first transistor has its source coupled to the first ground line to decode a second bit in a second phase.

16. A read-only memory comprising:

a plurality of bit lines including a first bit line and a second bit line;

a first transistor having a drain coupled to the first bit line;

a decoder configured to determine that the first transistor has its drain coupled to the first bit line to decode a first bit;

a first ground line; and a second ground line, wherein the first transistor includes a source coupled to the first ground line, and wherein the decoder is further configured to determine that the first transistor has its source coupled to the first ground line to decode a second bit.

17. The read-only memory of claim 16, further comprising:

a switch transistor coupled between the second ground line and ground, wherein the read-only memory is configured to maintain the switch transistor off during a first sensing phase for the decoder and to maintain the switch transistor on during a second sensing phase for the decoder.

18. The read-only memory of claim 16, wherein the first transistor is included within a bitcell including a second transistor.

19. The read-only memory of claim 18, wherein the second transistor has a drain coupled to the second bit line and has a source coupled to the second ground line.

20. The read-only memory of claim 17, wherein the decoder determines a drain coupling of the first transistor during the first sensing phase and determines a source coupling of the first transistor during the second sensing phase.

* * * * *